United States Patent [19]

Yero

[11] Patent Number: 5,859,798
[45] Date of Patent: Jan. 12, 1999

[54] READ CIRCUIT FOR NON-VOLATILE MEMORY WORKING WITH A LOW SUPPLY VOLTAGE

[75] Inventor: Emilio Miguel Yero, Aix-en-Provence, France

[73] Assignee: SGS-Thomson Microelectronics S.A., Crolles Cedex, France

[21] Appl. No.: 934,696

[22] Filed: Sep. 22, 1997

[30] Foreign Application Priority Data

Sep. 29, 1996 [FR] France .................................... 96 11833

[51] Int. Cl.[6] .................................................. G11C 16/06
[52] U.S. Cl. ................................ 365/185.25; 365/185.21; 365/149; 365/189.11; 365/190
[58] Field of Search ......................... 365/185.21, 189.07, 365/210, 230.05, 149, 189.01, 190

[56] References Cited

U.S. PATENT DOCUMENTS

| | | |
|---|---|---|
| 4,725,984 | 2/1988 | Ip et al. . |
| 4,761,764 | 8/1988 | Watanabe ............................ 365/185.21 |
| 4,807,188 | 2/1989 | Casagrande ......................... 365/185.21 |
| 5,412,348 | 5/1995 | Kasha et al. . |
| 5,563,826 | 10/1996 | Pascucci et al. .................... 365/185.21 |

OTHER PUBLICATIONS

R. Gastaldi et al., IEEE Journal of Solid–State Circuits, "A 1–MBit CMOS EPROM with Enhanced Verification", vol. 23, No. 5, Oct. 1998, pp. 1150–1156

T. Serrano et al., IEEE Transactions on Circuits and Systems I: Fundamental Theory and Applications, "The Active–Input Regulated–Cascode Current Mirror", vol. 41, No. 6, Jun. 1994, pp. 464–467.

M.G. Johnson, IEEE Journal of Solid–State Circuits, "An Input–Free VT Extractor Circuit Using a Two–Transistor Differential Amplifier", vol. 28, No., 6, Jun. 1993, pp. 704–705.

Primary Examiner—David Nelms
Assistant Examiner—Thong Le
Attorney, Agent, or Firm—Allen, Dyer, Doppelt, Milbrath & Gilchrist, P.A.

[57] ABSTRACT

The memory, in integrated circuit form, is supplied with a low supply voltage and includes a read circuit enabling the detection of the state of the cells of the memory. In a current mirror of the read circuit, there is provided a shifting circuit between the drain and the gate of a reference transistor. The shifting circuit may include a shift transistor and a bias transistor.

23 Claims, 3 Drawing Sheets

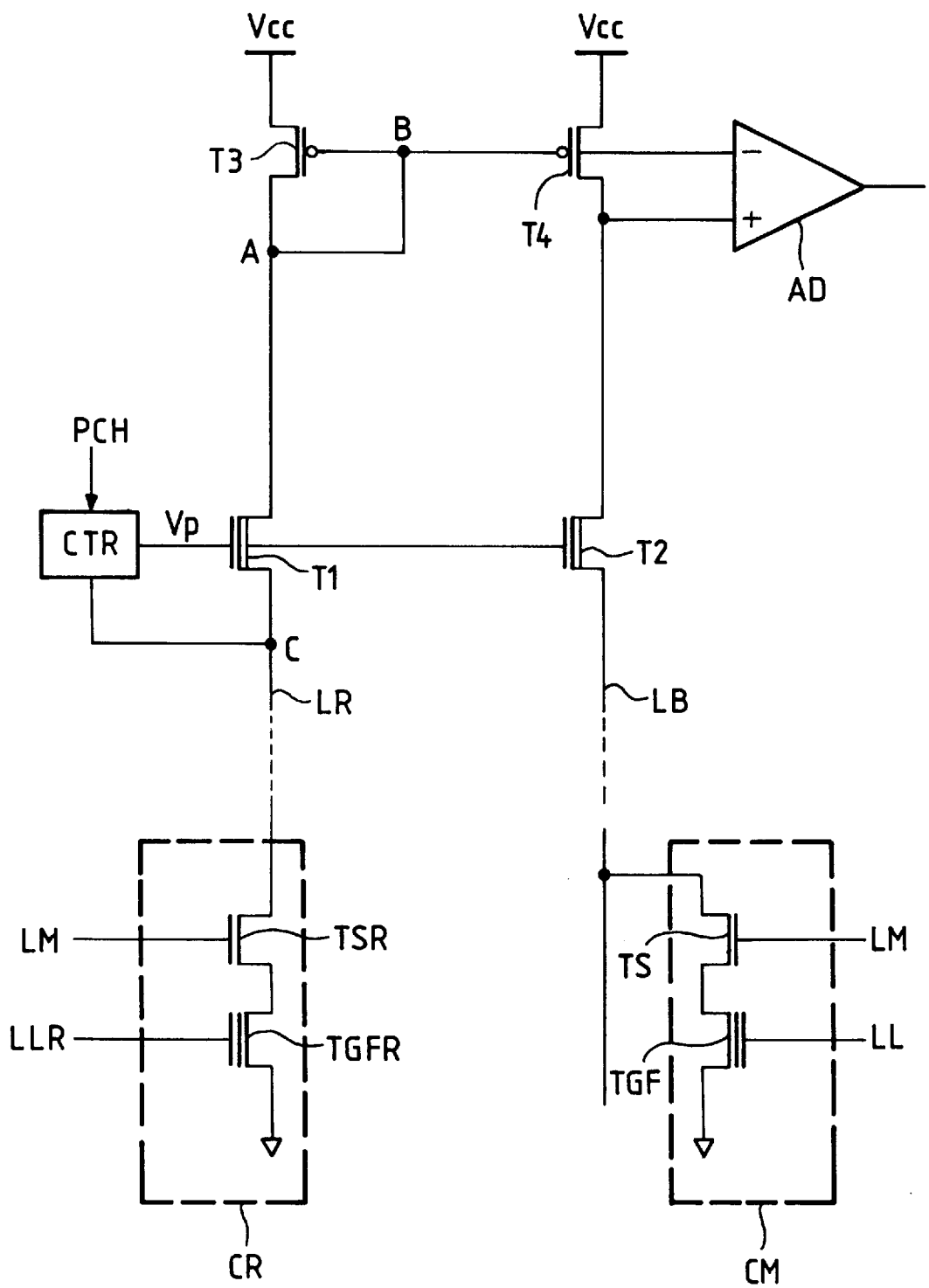
FIG_1
(PRIOR ART)

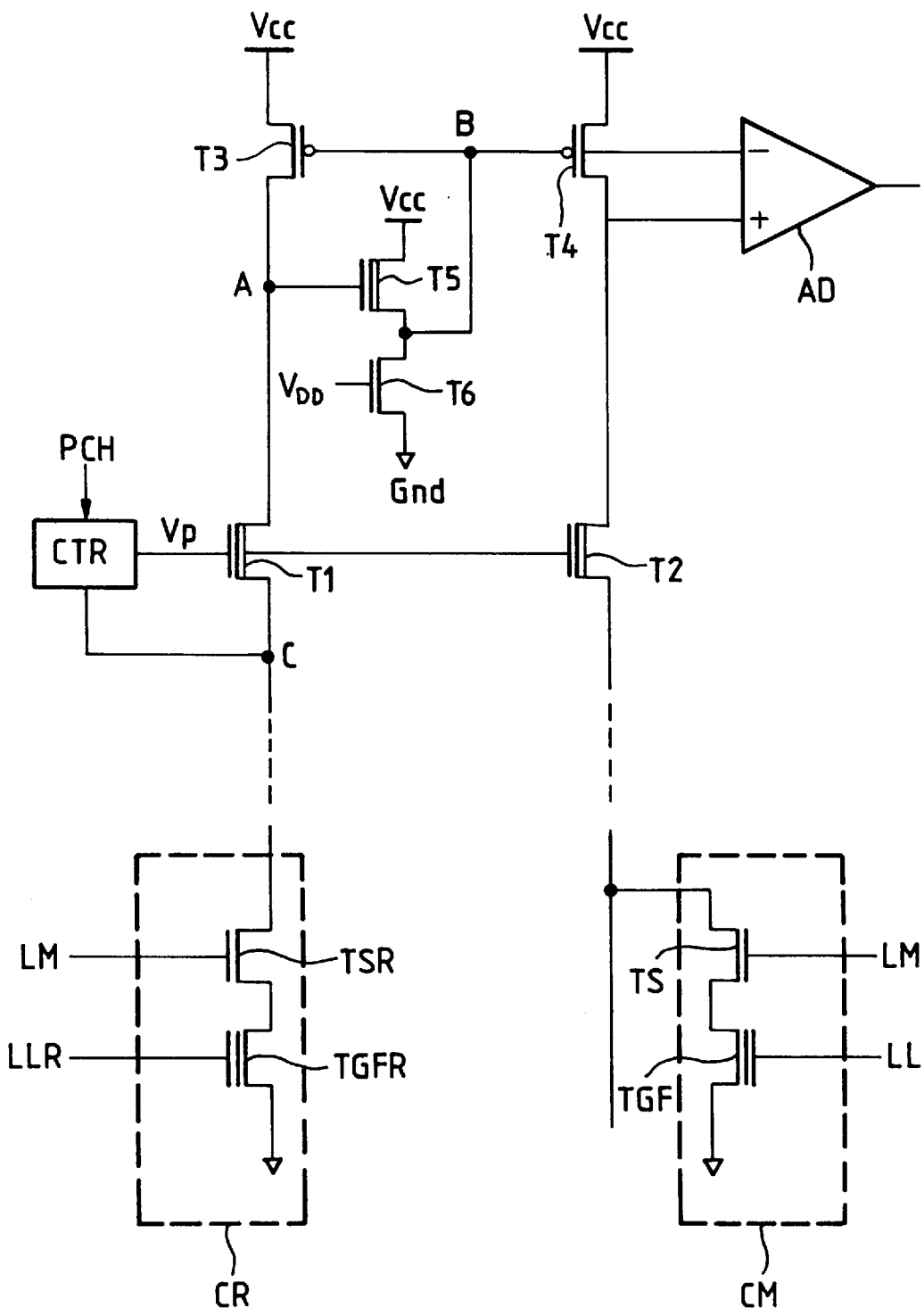
FIG_2

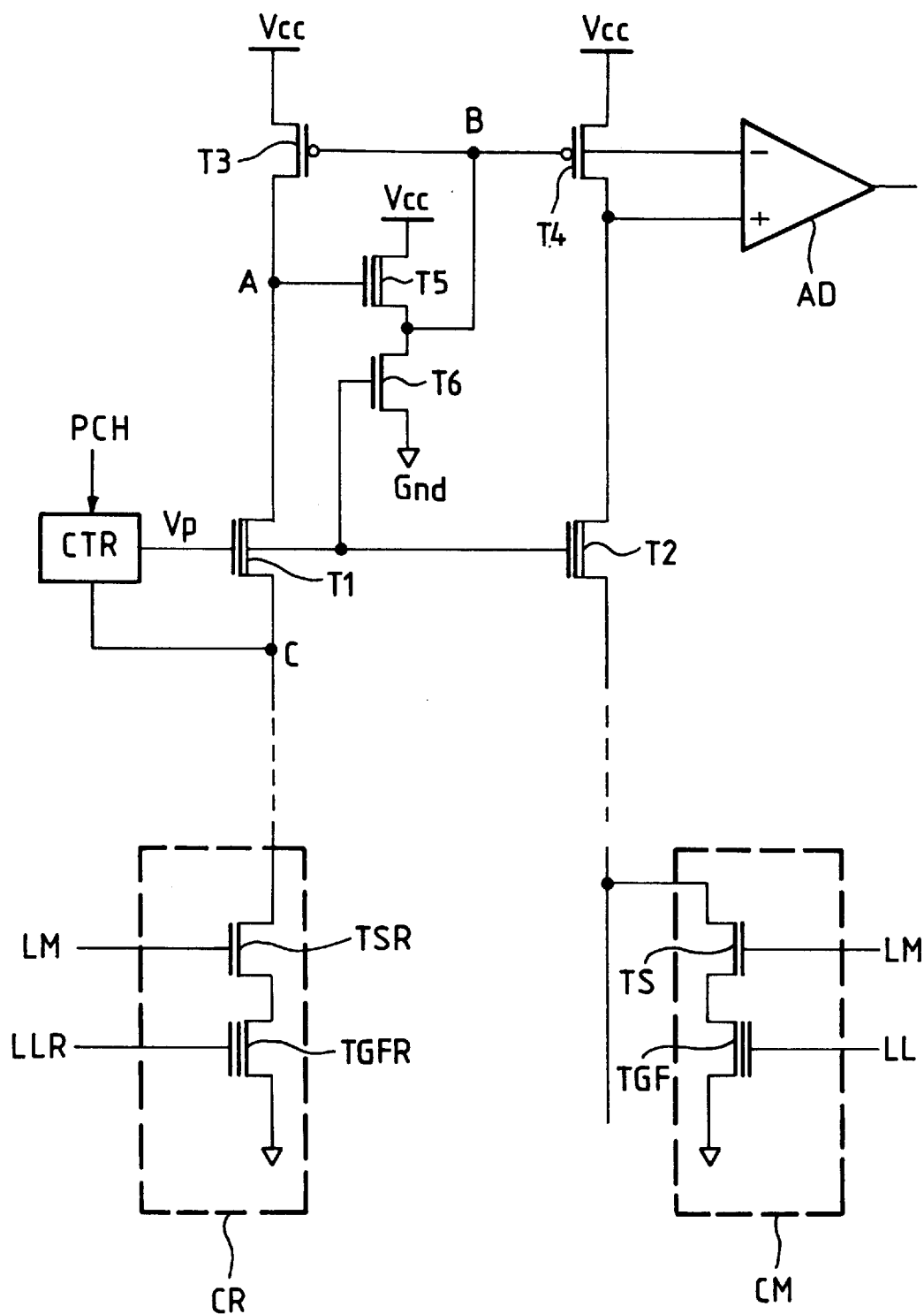
FIG_3

READ CIRCUIT FOR NON-VOLATILE MEMORY WORKING WITH A LOW SUPPLY VOLTAGE

FIELD OF THE INVENTION

The invention relates to memories in integrated circuit form supplied with a low supply voltage, and, more particularly, to read circuits enabling the detection of the state of the cells of the memory. The invention can be applied to electrically modifiable non-volatile memories (EPROMs, EEPROMs, Flash EPROMs).

BACKGROUND OF THE INVENTION

A memory comprises a network of memory cells organized in matrix form in columns and in rows. The memory cells of one and the same column are connected to a bit line and the memory cells of one and the same row are connected to a word line. During a reading stage, the bit line delivers an information element on the state of the memory cell at the intersection of the bit line and a selected word line.

The read circuits are connected to the bit lines either directly or, more generally, by means of a multiplexer used to associate a read circuit with several bit lines. Only one bit line is described as associated with the read circuit to simplify the explanation as follows. The working of a read circuit can generally be sub-divided into three stages: a bit line pre-charging stage, a balancing stage and a memory cell reading stage. Hereinafter, it should be assumed that the memory is an EEPROM whose cells may have an erased state in which they pass an electrical current, or a programmed state in which they hinder the passage of a current. To read an information element on the state of the selected cell, it is desired to detect the presence of a current in the bit line connected to the selected cell. And a current of this kind exists if the cell is erased or blank, and it does not exist if the cell is programmed.

To detect the presence of this current, a bit line connected to blank cells called reference cells is used. This bit line, called a reference line, carries a reference current during the reading stage. During the pre-charging stage, the bit line connected to the memory cell to be read and the reference line are taken to a reference potential. The balancing stage that follows enables the balancing of the potential of the two bit lines. Then, during the reading stage, the current of the bit line is compared with the reference current. The result of this comparison makes it possible to find out the state of the cell read. This comparison is generally made by a differential amplifier preceded by a current/voltage converter.

FIG. 1 gives a simplified view of an exemplary prior art read circuit. For the sake of greater clarity, this Figure does not describe the mechanisms for balancing the bit lines. A memory cell CM comprising a selection transistor TS series connected with a floating-gate transistor TGF is connected to a bit line LB. The gate of the selection transistor TS is connected to a word line LM, while the gate of the floating-gate transistor TGF is connected to a read line LL to which there is applied a read voltage VL during the reading phase. At the end of the reading operation, the information representing the state of the memory cell CM is delivered on the bit line LB.

Similarly, a reference cell CR comprising a selection transistor TSR and a floating-gate transistor TGFR is connected to a reference line LR. The gate of the selection transistor TSR is also connected to the word line LM and the gate of the floating-gate transistor TGFR is connected to a read line LLR to which there is applied the read voltage VL during the reading stage. During the pre-charging stage, the two bit lines LB and LR are pre-charged at a reference value of about 1 volt respectively by means of the pre-charging transistors T1 and T2. These transistors T1 and T2 have the function of respectively giving a pre-charging current to the two bit lines LB and LR, while at the same time limiting the reference voltage to a predetermined value close to one volt.

Indeed, if the reference voltage of the line is too high, there is a risk of parasitic programming of the memory cell CM attached to the bit line LB. If the reference voltage is too low, the current flowing in the bit line LB will not be high enough to obtain sufficiently fast reading of the memory cell CM.

The transistors T1 and T2 are preferably N channel natural transistors and their sources are connected respectively to the bit line LB and to the reference line LR. To simplify the drawing, the pre-charging circuit is shown in the form of a feedback block CTR connecting the gate of the transistors T1 and T2 to the source of the transistor T1. The role of this feedback block is to provide a sufficient pre-charging voltage Vp to the gate of the transistors T1 and T2 to pre-charge the bit lines LB and LR at the reference voltage.

Furthermore, the drains of the transistors T1 and T2 are connected to the two arms of a current mirror. The first arm has a P-channel reference transistor T3 having its drain and its gate connected to each other (in a diode configuration) and its source connected to a supply terminal Vcc. Its drain is furthermore connected to the drain of the pre-charging transistor T1. The second arm of the current mirror is provided by a P-channel transistor which mirrors transistor T4. Transistor T4 has its gate connected to the gate and drain of the transistor T3, with its source connected to the supply terminal Vcc and its drain connected to the drain of the transistor T2.

To make it easier to understand the explanations that follow, the drain of the reference transistor T3 is indicated by the point A, its gate by the point B, and the source of the transistor T1 by the point C.

Finally, a differential amplifier AD has its inputs connected to the drains of the transistors T3 and T4 and measures the difference between the potentials at these two drains. The output of the amplifier AD produces a signal that indicates whether the difference is positive or negative.

This type of circuit works well when it is supplied with a supply voltage in the range of 5 volts. However, it has the drawback of being unsuited for memories supplied with a voltage in the range of about 1.8 volts. Indeed, in the latter case, when the reference transistor T3 is conductive, the potential at the point A is at most equal to 1 volt if it is assumed that the threshold voltage Vt of the reference transistor T3 is equal to 0.8 volts. It is then difficult to maintain a stable potential of about 1 volt at the point C during the pre-charging phase if it is assumed in addition that the current flowing in the reference line LR will contribute to further lowering of the potential at the point C.

SUMMARY OF THE INVENTION

In view of the foregoing background, it is therefore an object of the present invention to provide an integrated circuit memory operable at lower voltages.

This and other objects, features and advantages in accordance with the present invention are provided by an integrated circuit memory comprising: at least one bit line and one reference line to which there are connected memory cells; a read circuit comprising a differential amplifier;

means for pre-charging the bit line and the reference line activated by a pre-charging voltage and a current mirror to supply current to the bit line and the reference line, and wherein the current mirror comprises a reference transistor and a mirror transistor having their gates connected to each other, their sources connected to a supply terminal and their drains connected respectively to the means for pre-charging the bit line and the reference line. Moreover, the memory also preferably includes shifting means for shifting the potential of the drain of the reference transistor before being applied to the gate of the reference transistor.

According to a particular embodiment, the shifting means may comprise a shift transistor with its drain connected to the supply terminal, its gate connected to the drain of the reference transistor and its source connected firstly to the gate of the reference transistor and secondly to the drain of a bias transistor. The bias transistor may have its source connected to a ground terminal and its gate connected to a biasing source.

Preferably, the bias transistor is sized so as to be highly resistive to thereby limit the current consumption of the shifting means. According to a second embodiment, there is provision for different shifting means also used to reduce the pre-charging time of the bit lines.

BRIEF DESCRIPTION OF THE DRAWINGS

Other features and advantages of the invention shall appear from the following detailed description, made with reference to the appended drawings, of which:

FIG. 1, which has already been described, shows a prior art read circuit;

FIG. 2 shows a read circuit according to an embodiment of the invention; and

FIG. 3 shows a read circuit according to another embodiment.

DETAILED DESCRIPTION OF THE PREFERRED EMBODIMENTS

FIG. 2 differs from FIG. 1 in that voltage shifting means is added between the drain and the gate of the reference transistor T3. This shifting means comprises a shift transistor T5 series connected with a bias transistor T6. The transistor T5 is connected as a follower. Its gate is connected to the drain of the reference transistor T3, its drain is connected to the supply terminal Vcc and its source is connected firstly to the gate of the reference transistor T3 and secondly to the drain of the bias transistor T6. The source of the bias transistor T6 is furthermore connected to a ground terminal Gnd and a bias voltage Vdd is applied to its gate.

In this embodiment, the shift transistor T5 is a natural transistor with a threshold voltage of about 0.4 volts. Its role is to shift the potential from the point A by 0.4 volts and apply the resultant potential to the gate of the reference transistor T3. The function of the transistor T6 is to bias the transistor T5. The transistor T6 is chosen so as to be highly resistive and limits the current consumption in the shifting means. Furthermore, the bias voltage Vdd is preferably slightly greater than the threshold voltage of the transistor T6 to limit the bias current. The transistor chosen, for example, may be a transistor T5 with a ratio W/L equal to 4/2 and with a bias voltage Vdd equal to 0.85 volts.

Thus, the present invention permits the transistor T3 to be conductive for a drain-source voltage Vds of 0.4 volts as compared with the previous value of 0.8 volts. The pre-charging phase can, therefore, be carried out with a potential of 1.4 volts at the point A. During this phase, the feedback circuit CTR delivers a pre-charging voltage and, by means of the transistors T1 and T2, imposes a reference voltage close to 1 volt on the reference line LR and the bit line LB. The pre-charging current of the lines LR and LB is given respectively by the reference transistor T3 and the copying or mirror transistor T4. During the reading phase that follows, a comparison is made between the current consumed by the bit line and the current flowing in the reference line.

Thus, during the pre-charging phase, the potential at the point A will get stabilized in the region of 1.4 volts. There is then a sufficient margin available at the pre-charging transistors T1 and T2 so that the feedback circuit CTR may be capable of pre-charging the lines LR an LB at about 1 volt. This was not possible with the prior art read circuit of FIG. 1.

In another embodiment illustrated in FIG. 3, the shifting means is somewhat modified to reduce the pre-charging time of the bit line LB and of the reference line LR According to this alternative embodiment, the gate of the bias transistor T6 is no longer connected to a stable voltage source Vdd but directly receives the pre-charging voltage Vp delivered by the feedback circuit CTR. The working of this circuit is as follows: at the beginning of the pre-charging phase, the bit line LB is equivalent to a large capacitor which must be charged from the ground potential. This is why at the beginning of the pre-charging stage, the feedback circuit CTR applies a pre-charging voltage Vp to the gate of the pre-charging transistor T1. This pre-charging voltage Vp is close to the supply voltage Vcc.

The bias transistor T6 then becomes highly conductive and the potential of the point B diminishes to attain a value close to the ground potential Gnd. The reference transistor T3 and the mirror transistor T4 then become highly conductive and the bit line LB gets charged even faster than in the first described embodiment.

At the end of the pre-charging phase, the feedback circuit CTR delivers a lower pre-charging voltage Vp of about 1.4 volts to obtain 1 volt at the point C. Under this condition of the pre-charging voltage, the transistor T6 will then bias the shift transistor T5 and no longer bring the ground potential to the point B. In this embodiment, the bias transistor T6 is less resistive than in the case of FIG. 2. The W/L ratio of the transistor T6 may be equal to, for example, 6/2.

What is claimed is:

1. A memory integrated circuit comprising:
   a plurality of memory cells;
   at least one bit line and one reference line connected to said memory cell; and
   a read circuit comprising
      pre-charging means for pre-charging the at least one bit line and the reference line responsive to a pre-charging signal,
      a current mirror to supply current to the at least one bit line and the reference line, said current mirror comprising a reference transistor and a mirror transistor, the reference transistor and the mirror transistor having respective gates connected to each other, the reference transistor and mirror transistor having respective sources connected to a supply, the reference transistor having a drain connected to the pre-charging means, and the mirror transistor having a drain connected to the reference line,
      a differential amplifier connected to said current mirror, and shifting means connected between the drain and gate of the reference transistor for shifting a potential of the drain of the reference transistor with a shifting voltage and applying the resulting potential to the gate of the reference transistor.

2. The memory according to claim 1, wherein said shifting means comprises a shift transistor and a bias transistor; wherein the shift transistor has a drain connected to the supply terminal, a gate connected to the drain of the reference transistor and a source connected firstly to the gate of the reference transistor and secondly to a drain of the bias transistor; and wherein the bias transistor also has a source connected to ground and a gate connected to a biasing source.

3. The memory according to claim 2, wherein the bias transistor has a W/L ratio of not greater than about 4/2 so as to be highly resistive.

4. The memory according to claim 3, wherein the biasing source is about 0.85 volts.

5. The memory according to claim 1, wherein said shifting means comprises a shift transistor and a bias transistor; wherein the shift transistor has a drain connected to the supply terminal, a gate connected to the drain of the reference transistor and a source connected firstly to the gate of the reference transistor and secondly to the drain of the bias transistor; and wherein the bias transistor also has a source connected to ground and a gate connected to said pre-charging means.

6. The memory according to claim 5, wherein said bias transistor has a W/L ratio of about 6/2.

7. A memory integrated circuit comprising:
   a plurality of memory cells;
   at least one bit line and one reference line connected to said memory cell; and
   a read circuit comprising
      pre-charging means for pre-charging the at least one bit line and the reference line,
      a current mirror to supply current to the at least one bit line and the reference line, said current mirror comprising a reference transistor and a mirror transistor, the reference transistor and the mirror transistor having respective gates connected to each other, the reference transistor and mirror transistor having respective sources connected to a supply, the reference transistor having a drain connected to said pre-charging means, and the mirror transistor having a drain connected to the reference line, and
      shifting means connected between the drain and the gate of the reference transistor for shifting a potential of the drain of the reference transistor with a shifting voltage and applying the resulting potential to the gate of the reference transistor.

8. The memory according to claim 7, wherein said shifting means comprises a shift transistor and a bias transistor; wherein the shift transistor has a drain connected to the supply terminal, a gate connected to the drain of the reference transistor and a source connected firstly to the gate of the reference transistor and secondly to a drain of the bias transistor; and wherein the bias transistor also has a source connected to ground and a gate connected to a biasing source.

9. The memory according to claim 8, wherein the bias transistor has a W/L ratio of not greater than about 4/2 so as to be highly resistive.

10. The memory according to claim 9, wherein the biasing source is about 0.85 volts.

11. The memory according to claim 7, wherein said shifting means comprises a shift transistor and a bias transistor; wherein the shift transistor has a drain connected to the supply terminal, a gate connected to the drain of the reference transistor and a source connected firstly to the gate of the reference transistor and secondly to the drain of the bias transistor; and wherein the bias transistor also has a source connected to ground and a gate connected to said pre-charging means.

12. The memory according to claim 11, wherein said bias transistor has a W/L ratio of about 6/2.

13. A memory read circuit comprising:
   pre-charging means for pre-charging at least one bit line and reference line;
   a current mirror to supply current to the at least one bit line and reference line, said current mirror comprising a plurality of transistors; and
   shifting means for shifting a potential to at least one of said plurality of transistors of said current mirror.

14. The memory read circuit according to claim 13, wherein said plurality of transistors comprises a reference transistor and a mirror transistor, the reference transistor and the mirror transistor having respective gates connected to each other, the reference transistor and mirror transistor having respective sources connected to a supply, the reference transistor having a drain connected to said pre-charging means, and the mirror transistor having a drain connected to the reference line.

15. The memory read circuit according to claim 14, wherein said shifting means comprises a shift transistor and a bias transistor; wherein the shift transistor has a drain connected to the supply terminal, a gate connected to the drain of the reference transistor and a source connected firstly to the gate of the reference transistor and secondly to a drain of the bias transistor; and wherein the bias transistor also has a source connected to ground and a gate connected to a biasing source.

16. The memory read circuit according to claim 15, wherein the bias transistor has a W/L ratio of not greater than about 4/2 so as to be highly resistive.

17. The memory read circuit according to claim 16, wherein the biasing source is about 0.85 volts.

18. The memory read circuit according to claim 14, wherein said shifting means comprises a shift transistor and a bias transistor; wherein the shift transistor has a drain connected to the supply terminal, a gate connected to the drain of the reference transistor and a source connected firstly to the gate of the reference transistor and secondly to the drain of the bias transistor; and wherein the bias transistor also has a source connected to ground and a gate connected to said pre-charging means.

19. The memory read circuit according to claim 18, wherein said bias transistor has a W/L ratio of about 6/2.

20. A method for reading a memory of a type comprising a plurality of memory cells, at least one bit line and one reference line connected to said memory cell, and a read circuit comprising pre-charging means for pre-charging the at least one bit line and the reference line, and a current mirror to supply current to the at least one bit line and the reference line, said current mirror comprising a reference transistor and a mirror transistor, the reference transistor and the mirror transistor having respective gates connected to each other, the reference transistor and mirror transistor having respective sources connected to a supply, the reference transistor having a drain connected to said pre-charging means, and the mirror transistor having a drain connected to the reference line, the method comprising the step of:
   shifting a potential of the drain of the reference transistor with a shifting voltage and applying the resulting potential to the gate of the reference transistor.

21. The method according to claim 20, wherein the step of shifting comprises providing a shift transistor and a bias transistor; wherein the shift transistor has a drain connected to the supply terminal, a gate connected to the drain of the reference transistor and a source connected firstly to the gate of the reference transistor and secondly to a drain of the bias transistor; and wherein the bias transistor also has a source connected to ground and a gate connected to a biasing source.

22. The method according to claim 21, further comprising the step of operating the biasing source at about 0.85 volts.

23. The method according to claim 20, wherein the step of shifting comprises providing a shift transistor and a bias transistor; wherein the shift transistor has a drain connected to the supply terminal, a gate connected to the drain of the reference transistor and a source connected firstly to the gate of the reference transistor and secondly to the drain of the bias transistor; and wherein the bias transistor also has a source connected to ground and a gate connected to said pre-charging means.

* * * * *

UNITED STATES PATENT AND TRADEMARK OFFICE
CERTIFICATE OF CORRECTION

PATENT NO. : 5,859,798
DATED : January 12, 1998
INVENTOR(S) : YERO

It is certified that error appears in the above-identified patent and that said Letters Patent is hereby corrected as shown below:

Title page,

Item [30] Foreign Application Priority Data

Strike:
"Sep. 29, 1996"

Insert:
-- Sept. 24, 1996 --

Item [56] References Cited (Other Publications)

Strike:
"R. Gastaldi et al., IEEE Journal of Solid-State Circuits, "A 1-MBit CMOS EPROM With Enhanced Verification", Vol. 23, No. 5, October 1998, pp. 1150-1156"

UNITED STATES PATENT AND TRADEMARK OFFICE
CERTIFICATE OF CORRECTION

PATENT NO. : 5,859,798
DATED : January 12, 1999
INVENTOR(S) : YERO

It is certified that error appears in the above-identified patent and that said Letters Patent is hereby corrected as shown below:

Insert:
                      -- R. Gastaldi et al., IEEE Journal of Solid-State Circuits, "A 1-MBit CMOS EPROM With Enhanced Verification", Vol. 23, No. 5, October 1988, pp. 1150-1156 --

Column 4, Line 21      Strike:
"of the bit line LB and of the reference line LR According to"

Insert:
-- of the bit line LB and of the reference line LR. According to --

Signed and Sealed this

Eighteenth Day of May, 1999

Attest:

Q. TODD DICKINSON

Attesting Officer        Acting Commissioner of Patents and Trademarks